United States Patent
Ahn et al.

(10) Patent No.: US 10,491,337 B2
(45) Date of Patent: Nov. 26, 2019

(54) METHOD FOR TRANSMITTING ACK/NACK IN WIRELESS COMMUNICATION SYSTEM AND APPARATUS USING SAME

(71) Applicant: LG ELECTRONICS INC., Seoul (KR)

(72) Inventors: Joonkui Ahn, Seoul (KR); Suckchel Yang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/751,746

(22) PCT Filed: Aug. 10, 2016

(86) PCT No.: PCT/KR2016/008766
§ 371 (c)(1),
(2) Date: Feb. 9, 2018

(87) PCT Pub. No.: WO2017/026783
PCT Pub. Date: Feb. 16, 2017

(65) Prior Publication Data
US 2018/0241513 A1 Aug. 23, 2018

Related U.S. Application Data

(60) Provisional application No. 62/203,914, filed on Aug. 12, 2015.

(51) Int. Cl.
*H04L 1/18* (2006.01)
*H04L 1/00* (2006.01)
(Continued)

(52) U.S. Cl.
CPC ...... *H04L 1/1819* (2013.01); *H03M 13/6306* (2013.01); *H04L 1/0013* (2013.01);
(Continued)

(58) Field of Classification Search
CPC .................................................... H04L 1/1819
(Continued)

(56) References Cited

U.S. PATENT DOCUMENTS

2006/0156184 A1 7/2006 Kim et al.
2012/0327885 A1* 12/2012 Chung ................. H04L 1/1614
370/329

(Continued)

FOREIGN PATENT DOCUMENTS

WO    WO 2014/022861 A1    2/2014

OTHER PUBLICATIONS

Intel Corporation. "HARQ-ACK feedback for CA with up to 32 CCs." R1-152625. 3GPP TSG-RAN WG1 #81. Fukuoka, Japan, May 25-29, 2015.

(Continued)

*Primary Examiner* — Fritz Alphonse
(74) *Attorney, Agent, or Firm* — Birch, Stewart, Kolasch & Birch, LLP

(57) ABSTRACT

Provided are a method and an apparatus for transmitting an ACK/NACK in a wireless communication system. The apparatus generates an ACK/NACK payload according to the total number of configured cells, and generates a basic encoded bitstream by performing channel coding of the ACK/NACK payload according to a basic code rate. The apparatus generates and transmits a transmission encoded bitstream by rate-matching the basic encoded bitstream according to a transmission code rate.

12 Claims, 7 Drawing Sheets

(51) Int. Cl.
*H04L 5/00* (2006.01)
*H03M 13/00* (2006.01)
H03M 13/09 (2006.01)
H03M 13/29 (2006.01)

(52) U.S. Cl.
CPC .......... *H04L 1/0073* (2013.01); *H04L 5/0055* (2013.01); *H04L 5/0057* (2013.01); *H03M 13/09* (2013.01); *H03M 13/2957* (2013.01); *H04L 1/0067* (2013.01)

(58) Field of Classification Search
USPC ........................................................ 714/751
See application file for complete search history.

(56) References Cited

U.S. PATENT DOCUMENTS

| | | | | |
|---|---|---|---|---|
| 2013/0016687 A1* | 1/2013 | Yang | ..................... | H04L 1/1614 370/329 |
| 2014/0254520 A1* | 9/2014 | Seo | ..................... | H03M 13/353 370/329 |

OTHER PUBLICATIONS

LG Electronics. "HARQ-ACK payload adaptation for Rel-13 CA." R1-152718. 3GPP TSG RAN WG1 Meeting #81. Fukuoka, Japan, May 25-29, 2015.
LG Electronics. "HARQ-ACK PUCCH transmission for Rel-13 CA." R1-151502. 3GPP TSG RAN WG1 Meeting #80bis. Belgrade, Serbia, Apr. 20-24, 2015.

\* cited by examiner

METHOD FOR TRANSMITTING ACK/NACK IN WIRELESS COMMUNICATION SYSTEM AND APPARATUS USING SAME

CROSS REFERENCE TO RELATED APPLICATIONS

This application is the National Phase of PCT International Application No. PCT/KR2016/008766, filed on Aug. 10, 2016, which claims priority under 35 U.S.C. 119(e) to U.S. Provisional Application No. 62/203,914, filed on Aug. 12, 2015, all of which are hereby expressly incorporated by reference into the present application.

BACKGROUND OF THE INVENTION

Field of the Invention

The present invention relates to wireless communication, and more particularly, to a method of transmitting a positive-acknowledgement (ACK)/negative-acknowledgement (NACK) for hybrid automatic repeat request (HARQ) in a wireless communication system, and an apparatus using the method.

Related Art $3^{rd}$ generation partnership project (3GPP) long term evolution-advanced (LTE-A) is a technique satisfying a bandwidth of up to 100 MHz and a data rate of up to 1 Gbps. Carrier aggregation (CA) is one of techniques for increasing a maximum bandwidth by using a plurality of component carriers. One component carrier operates for one serving cell, and as a result, a terminal receives a service provided from a plurality of serving cells.

With the increase in the number of supported serving cells, an amount of feedback information reported by the terminal also increases. The feedback information includes channel state information (CSI), hybrid automatic repeat request (HARQ) ACK/NACK, or the like.

A physical uplink control channel (PUCCH) is defined for transmission of the feedback information. 3GPP LTE-A provides various PUCCH formats such as a PUCCH format 1/1a/1b, a PUCCH format 2/2a/2b, a PUCCH format 3, a PUCCH format 4, a PUCCH format 5, or the like according to a payload size.

With the increase in the number of serving cells supported in a CA environment, a method of transmitting uplink control information is proposed.

SUMMARY OF THE INVENTION

The present invention provides a method for transmitting an ACK/NACK in a wireless communication system, and an apparatus using the method.

In an aspect, a method of transmitting an ACK/NACK in a wireless communication system is provided. The method includes generating, by a wireless device, an ACK/NACK payload according to the total number of configured cells, generating, by the wireless device, a basic coded bitstream by performing channel coding on the ACK/NACK payload according to a mother code rate, generating, by the wireless device, a transmission coded bitstream by performing rate matching on the basic coded bitstream according to a transmission code rate, and transmitting, by the wireless device, the transmission coded bitstream through an uplink channel.

The number of bits of the transmission coded bitstream may be determined according to the transmission code rate and the number of scheduled cells.

In another aspect, an apparatus for transmitting an ACK)/NACK in a wireless communication system includes a transceiver configured to transmit and receive a radio signal, and a processor coupled to the transceiver. The processor is configured to generate an ACK/NACK payload according to the total number of configured cells, generate a basic coded bitstream by performing channel coding on the ACK/NACK payload according to a mother code rate, generate a transmission coded bitstream by performing rate matching on the basic coded bitstream according to a transmission code rate, and transmit the transmission coded bitstream through an uplink channel.

Even if the number of cells configured for a wireless device increases, the existing uplink channel is utilized to transmit uplink control information.

DESCRIPTION OF EXEMPLARY EMBODIMENTS

A wireless device may be fixed or mobile, and may be referred to as another terminology, such as a user equipment (UE), a mobile station (MS), a mobile terminal (MT), a user terminal (UT), a subscriber station (SS), a wireless device, a personal digital assistant (PDA), a wireless modem, a handheld device, etc. The wireless device may also be a device supporting only data communication such as a machine-type communication (MTC) device.

A base station (BS) is generally a fixed station that communicates with the wireless device, and may be referred to as another terminology, such as an evolved-NodeB (eNB), a base transceiver system (BTS), an access point, etc.

Hereinafter, it is described that the present invention is applied according to a $3^{rd}$ generation partnership project (3GPP) long term evolution (LTE)/LTE-advanced (LTE-A). However, this is for exemplary purposes only, and thus the present invention is also applicable to various wireless communication networks.

The wireless device may be served by a plurality of serving cells. Each serving cell may be defined with a downlink (DL) component carrier (CC) or a pair of a DL CC and an uplink (UL) CC. The plurality of serving cells may be managed by one BS, or may be managed by a plurality of BSs. The plurality of serving cells may be divided into a plurality of cell groups.

The serving cell may be classified into a primary cell (PCell) and a secondary cell (SCell). The PCell operates at a primary frequency, and is a cell designated as the PCell when an initial network entry process is performed or when a network re-entry process starts or in a handover process. The PCell is also called a reference cell. The SCell operates at a secondary frequency. The SCell may be configured after a radio resource control (RRC) connection is established, and may be used to provide an additional radio resource. At least one PCell is configured always. The SCell may be added, modified, or released by using higher-layer signaling (e.g., an RRC message).

A cell index (CI) of the primary cell may be fixed. For example, a lowest CI may be designated as a CI of the primary cell. It is assumed hereinafter that the CI of the primary cell is 0 and a CI of the secondary cell is allocated sequentially starting from 1.

Figure 1:
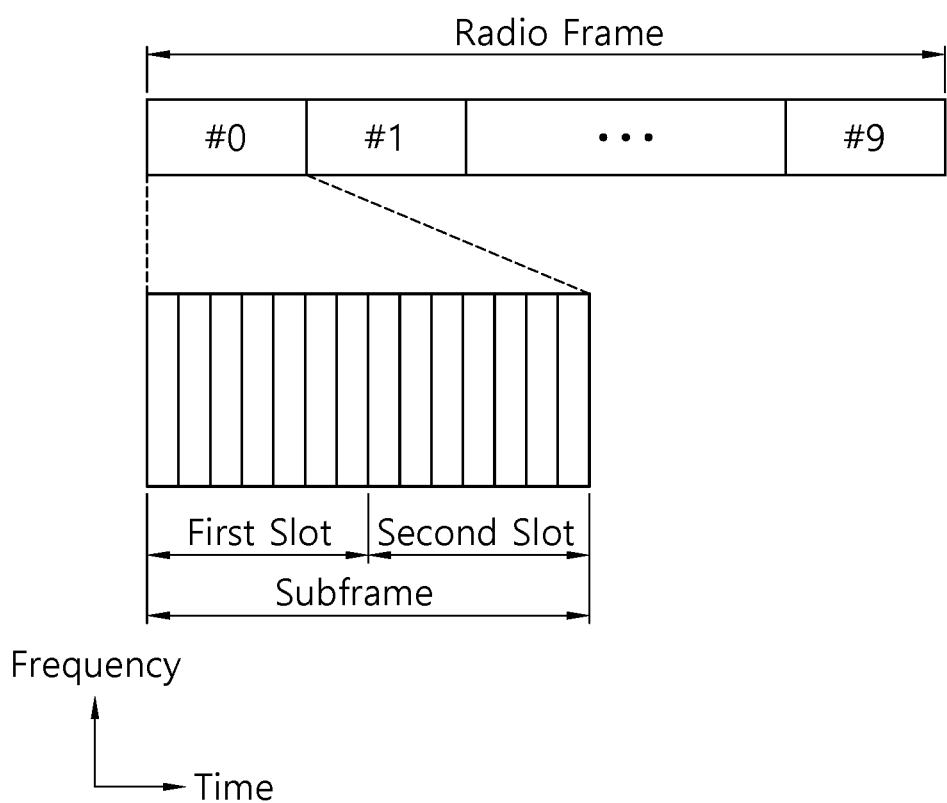
FIG. 1 shows a subframe structure in $3^{rd}$ generation partnership project (3GPP) long term evolution-advanced (LTE-A).

FIG. 1 shows a subframe structure in 3GPP LTE-A.

A radio frame includes 10 subframes indexed with 0 to 9. One subframe includes 2 consecutive slots. A time required for transmitting one subframe is defined as a transmission time interval (TTI). For example, one subframe may have a length of 1 millisecond (ms), and one slot may have a length of 0.5 ms.

A subframe may include a plurality of orthogonal frequency division multiplexing (OFDM) symbols. Since the 3GPP LTE uses orthogonal frequency division multiple access (OFDMA) in a downlink (DL), the OFDM symbol is only for expressing one symbol period in the time domain, and there is no limitation in a multiple access scheme or terminologies. For example, the OFDM symbol may also be referred to as another terminology such as a single carrier frequency division multiple access (SC-FDMA) symbol, a symbol period, etc.

Although it is described that one slot includes 14 OFDM symbols for example, the number of OFDM symbols included in one slot may vary depending on a length of a cyclic prefix (CP). According to 3GPP LTE-A, in case of a normal CP, one slot includes 14 OFDM symbols, and in case of an extended CP, one slot includes 12 OFDM symbols.

A resource block (RB) is a resource allocation unit, and includes a plurality of subcarriers in one slot. For example, if one slot includes 7 OFDM symbols in a time domain and the RB includes 12 subcarriers in a frequency domain, one RB may include 7×12 resource elements (REs).

A physical channel of 3GPP LTE-A may be classified into a downlink (DL) physical channel and an uplink (UL) physical channel. The DL physical channel includes a physical downlink control channel (PDCCH), a physical control format indicator channel (PCFICH), a physical hybrid-ARQ indicator channel (PHICH), and a physical downlink shared channel (PDSCH).

The PCFICH transmitted in a first OFDM symbol of the subframe carries a control format indicator (CFI) regarding the number of OFDM symbols (i.e., a size of the control region) used for transmission of control channels in the subframe. A wireless device first receives the CFI on the PCFICH, and thereafter monitors the PDCCH.

The PHICH carries a positive-acknowledgement (ACK)/negative-acknowledgement (NACK) signal for an uplink hybrid automatic repeat request (HARQ). The ACK/NACK signal for uplink (UL) data on a PUSCH transmitted by the wireless device is transmitted on the PHICH.

Control information transmitted through the PDCCH is referred to as downlink control information (DCI). The DCI may include resource allocation of the PDSCH (this is referred to as a downlink (DL) grant), resource allocation of a PUSCH (this is referred to as an uplink (UL) grant), a set of transmit power control commands for individual UEs in any UE group, and/or activation of a voice over Internet protocol (VoIP).

The UL physical channel includes a physical uplink control channel (PUCCH) and a physical uplink shared channel (PUSCH). The PUCCH is allocated in an RB pair in a subframe. RBs belonging to the RB pair occupy different subcarriers in each of a $1^{st}$ slot and a $2^{nd}$ slot. The PUSCH is allocated by a UL grant on the PDCCH. In a normal CP, a $4^{th}$ OFDM symbol of each slot is used in transmission of a demodulation reference signal (DMRS) for the PUSCH.

Uplink control information (UCI) includes at least any one of HARQ ACK/NACK, channel state information (CSI), and a scheduling request (SR). Hereinafter, as an indicator for indicating a state of a downlink (DL) channel, the CSI may include at least any one of a channel quality indicator (CQI) and a precoding matrix indicator (PMI).

In order to transmit a variety of UCI on a PUCCH, a combination between the UCI and the PUCCH is defined as a PUCCH format as shown in the following table.

TABLE 1

| PUCCH format | UCI to be transmitted |
| --- | --- |
| PUCCH format 1 | Positive SR |
| PUCCH format 1a/1b | 1-bit or 2-bit HARQ ACK/NACK |
| PUCCH format 2 | CSI report |
| PUCCH format 2a/2b | CSI report and 1-bit or 2-bit HARQ ACK/NACK |
| PUCCH format 3 | HARQ ACK/NACK, SR, CSI |

The PUCCH format 1a/1b is used to carry the 1-bit or 2-bit HARQ ACK/NACK by using binary phase shift keying (BPSK) modulation or quadrature phase shift keying (QPSK) modulation.

The PUCCH format 3 is used to carry encoded UCI of 48 bits. The PUCCH format 3 may carry HARQ ACK/NACK for a plurality of serving cells and a CSI report for one serving cell.

Figure 2:
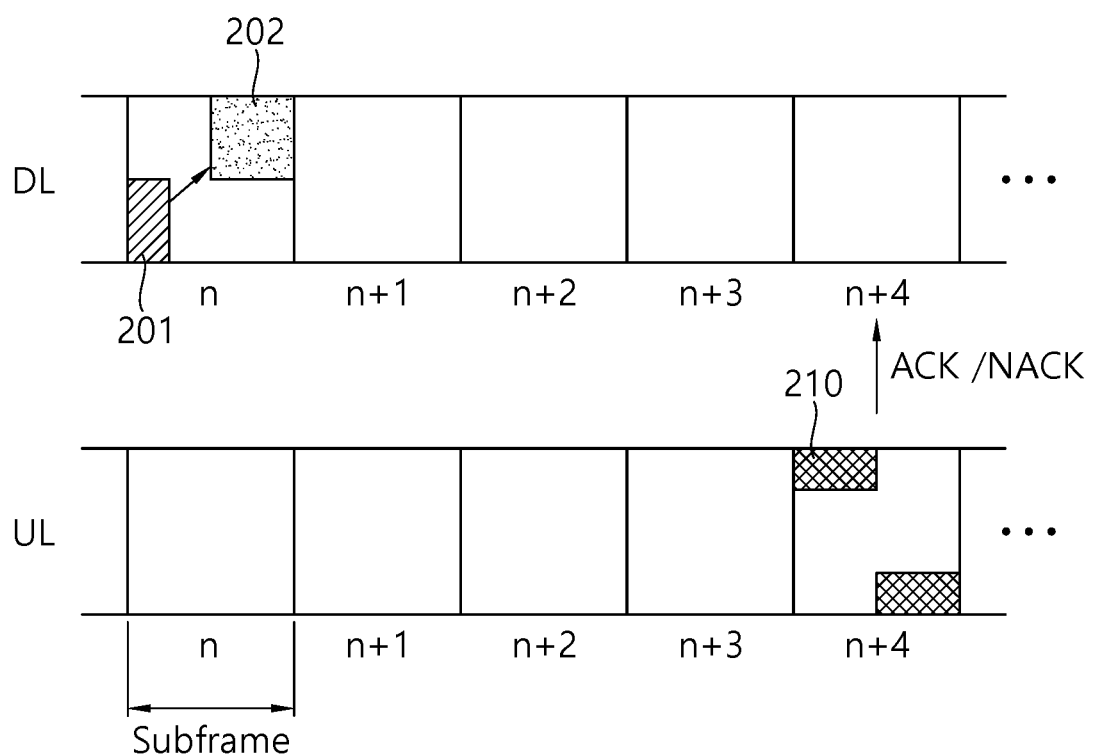
FIG. 2 shows an example of performing hybrid automatic repeat request (HARQ).

FIG. 2 shows an example of performing HARQ.

A wireless device monitors a PDCCH, and receives a DL grant including a DL resource allocation on a PDCCH 201 (or EPDDCH) in a DL subframe n. The wireless device receives a DL transport block through a PDSCH 202 indicated by the DL resource allocation.

The wireless device transmits an ACK/NACK signal for the DL transport block on a PUCCH 210 in a UL subframe n+4. The ACK/NACK signal corresponds to an ACK signal when the DL transport block is successfully decoded, and corresponds to a NACK signal when the DL transport block fails in decoding. Upon receiving the NACK signal, a BS may retransmit the DL transport block until the ACK signal is received or until the number of retransmission attempts reaches its maximum number.

In 3GPP LTE-A, a PUCCH format 1/1a/1b, a PUCCH format 2/2a/2b, a PUCCH format 3, a PUCCH format 4 and a PUCCH format 5 are used to carry an ACK/NACK signal which is a reception acknowledgement for HARQ. All PUCCH formats use different resource blocks in two slots.

Figure 3:
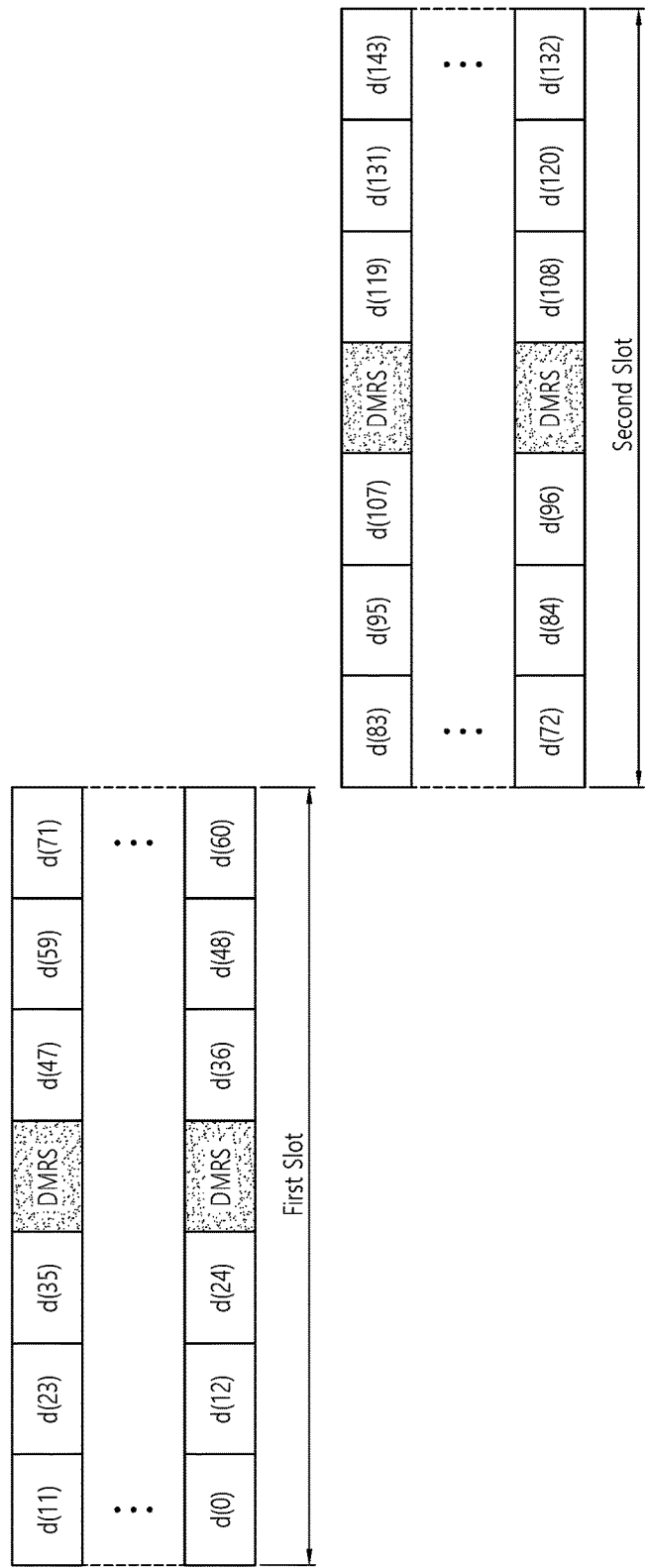
FIG. 3 shows an example of a channel structure for a physical uplink control channel (PUCCH) format 3.

FIG. 3 shows an example of a channel structure for a PUCCH format 3.

One slot includes 7 OFDM symbols. $2^{nd}$ and $6^{th}$ OFDM symbols are RS OFDM symbols for DMRS. The remaining 5 OFDM symbols are data OFDM symbols for UCI.

The PUCCH format 3 may carry 24 data symbols d(0) to d(23). When using QPSK, the PUCCH format 3 may carry 48 encoded bits.

In a first slot, first 12 data symbols d(0) to d(11) are spread in a time domain by using an orthogonal code W(j)={w(0), w(1), w(2), w(3), w(4)}. The time-domain spreading includes that w(i) corresponds to each OFDM symbol in a slot. In a second slot, second 12 data symbols d(12) to d(23) are spread in the time domain by using the orthogonal code W(j).

A time/frequency/code resource used in PUCCH transmission is called a PUCCH resource. For example, an orthogonal code index, a cyclic shift index, and a resource block index are required for the PUCCH format 1/1a/1b. A cyclic shift index and a resource block index are required for the PUCCH format 2/2a/2b. An orthogonal code index and a resource block index are required for the PUCCH format 2/2a/2b. A resource index is a parameter used to determine a corresponding PUCCH resource.

A resource index for the PUCCH format 1a/1 b for ACK/NACK is given by a corresponding DL grant. Although a resource index for the PUCCH format 3 for ACK/NACK is given by a corresponding DL grant, this is designated in a pre-designated resource index set. For example, a BS pre-designates 4 resource indices for the PUCCH format 3 through an RRC message. In addition, one of the 4 resource indices may be designated through a resource indicator in a DL grant (this is called an 'ACK/NACK resource indicator (ARI)').

Figure 4:
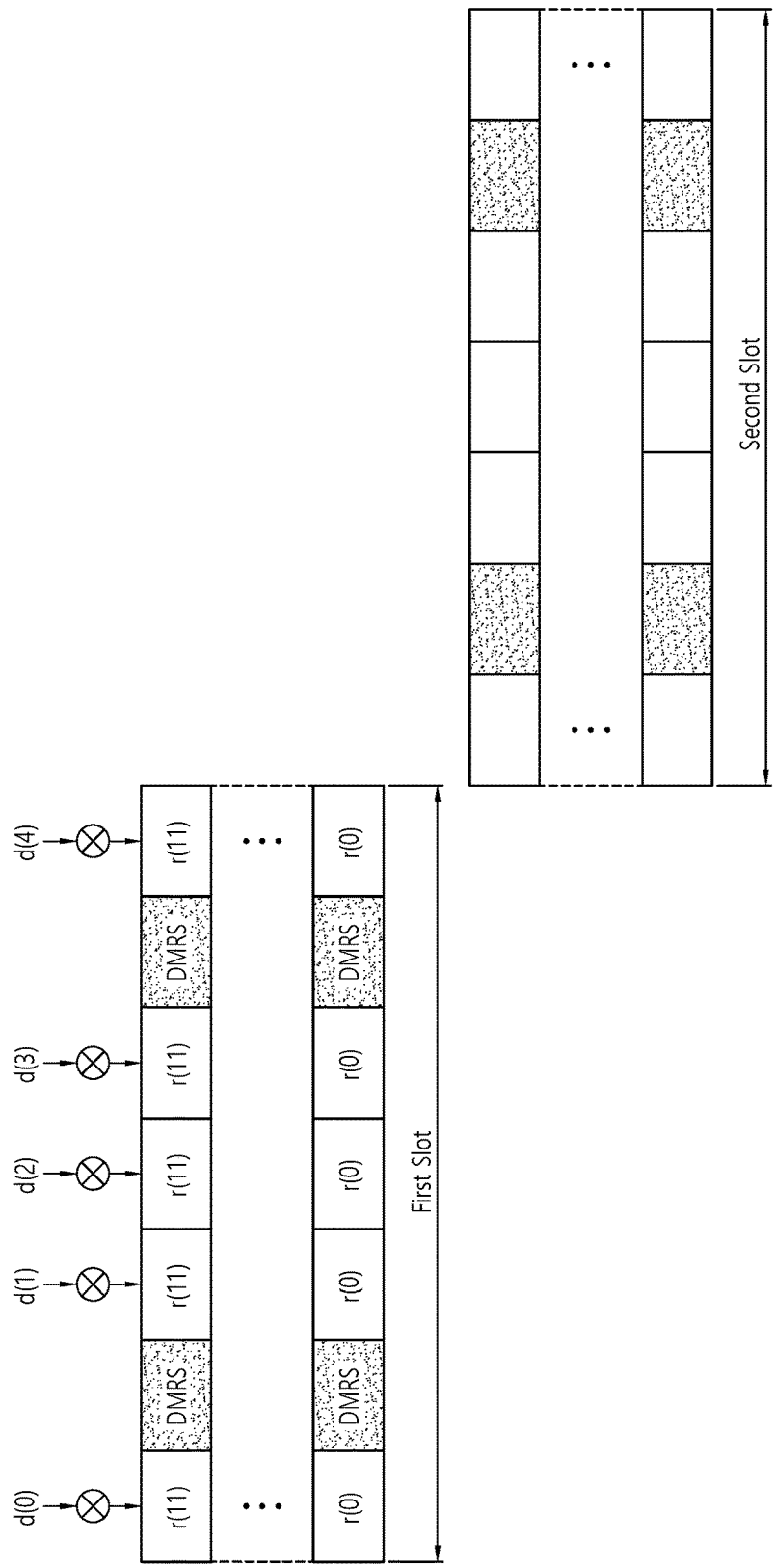
FIG. 4 shows an example of a channel structure for a PUCCH format 4.

FIG. 4 shows an example of a channel structure for a PUCCH format 4.

One slot includes 7 OFDM symbols. An OFDM symbol in the middle (i.e., a $4^{th}$ OFDM symbol) is an RS OFDM symbol for DMRS. The remaining 6 OFDM symbols are data OFDM symbols for UCI. If one slot includes 6 OFDM symbols, a $3^{rd}$ OFDM symbol is an RS OFDM symbol, and the remaining 5 OFDM symbols are data OFDM symbols.

The extended PUCCH format does not use frequency-domain spreading and time-domain spreading. When one resource is allocated to the extended PUCCH format, 12 data symbols may be transmitted for each OFDM symbol. Therefore, 144 data symbols d(0) to d(143) may be transmitted in one subframe. When using QPSK, the extended PUCCH format may carry 288 encoded bits.

Figure 5:
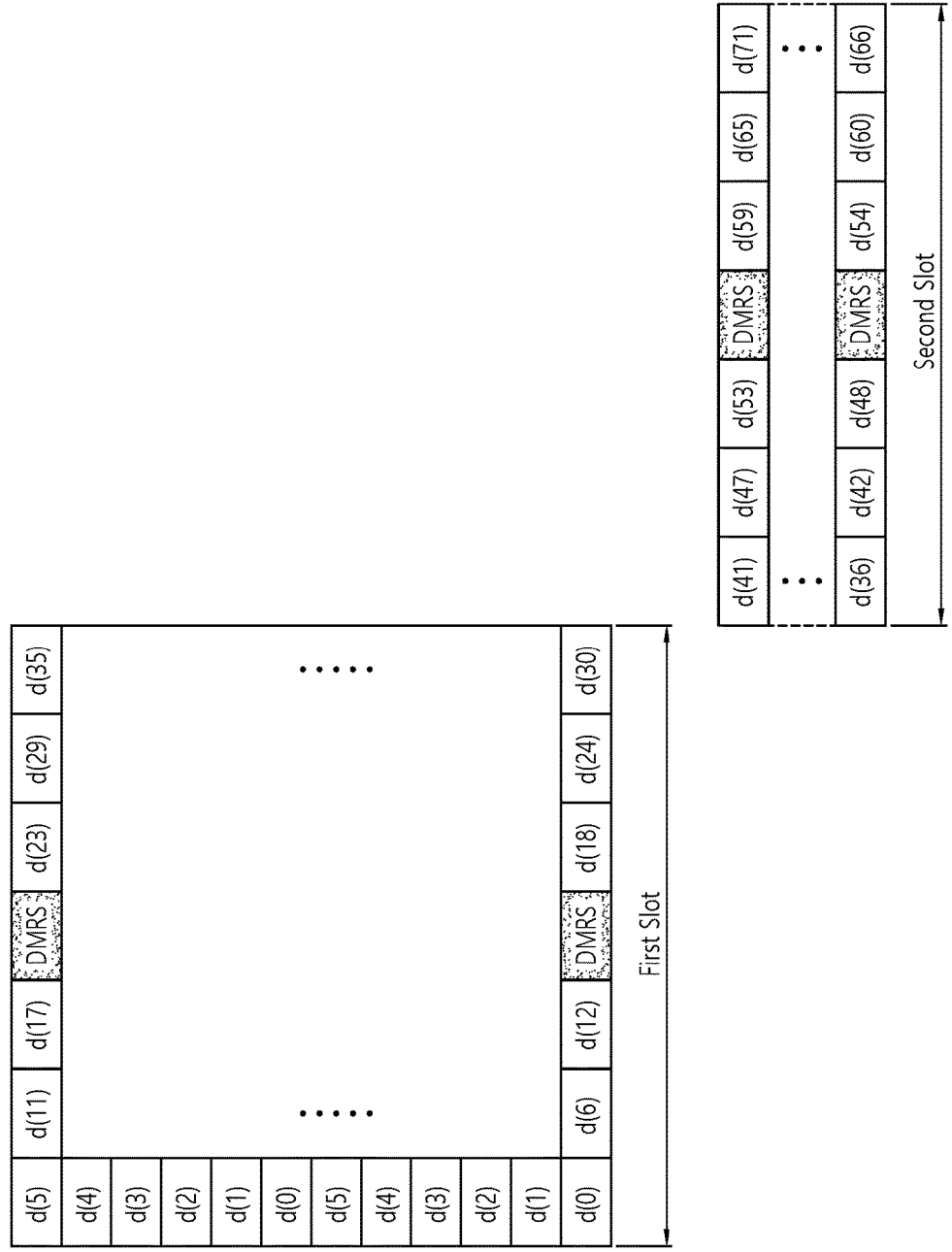
FIG. 5 shows an example of a channel structure for a PUCCH format 5.

FIG. 5 shows an example of a channel structure for a PUCCH format 5.

In comparison with the channel structure of FIG. 3, 6 data symbols are repeated in one resource block for each OFDM symbol. For example, {d(0), d(1), d(2), d(3), d(4), d(5), d(0), d(1), d(2), d(3), d(4), d(5)} is transmitted in a first OFDM symbol. Accordingly, although 144 data symbols can be transmitted in the channel structure of FIG. 3, 72 data symbols d(0) to d(71) may be transmitted in this channel structure. When using QPSK, the extended PUCCH format may carry 144 encoded bits.

In order to support multi-user multiplexing, code division multiplexing (CDM) may be supported in a data symbol repeated in each OFDM symbol. For example, {+d(0), +d(1), +d(2), +d(3), +d(4), +d(5), +d(0), +d(1), +d(2), +d(3), +d(4), d(5)} may be transmitted through CDM 0, and {+d(0), +d(1), +d(2), +d(3), +d(4), +d(5), −d(0), −d(1), −d(2), −d(3), −d(4), −d(5)} may be transmitted through CDM 1. A cyclic shift value used in DMRS may vary depending on the CDM.

A plurality of resource blocks may be allocated to the PUCCH format 4. That is, only one resource block may be allocated to the conventional PUCCH format 1/2/3, whereas one or more resource blocks may be allocated to the PUCCH format 4.

Similarly to the configuration of the PUCCH format 3, in the resource configuration for the PUCCH format 4/5, a plurality of candidate resources may be configured in advance through an RRC message, and one of the plurality of candidate resources may be designated through a DL grant.

A plurality of cells are configured for a wireless device in a CA environment. According to the existing 3GPP LTE, the wireless device generates an ACK/NACK feedback on the basis of the total number of cells configured for the wireless device. For example, even if 10 cells are configured and a PDSCH is received from 5 cells out of the 10 cells, the wireless device transmits an ACK/NACK feedback for all of the 10 cells on a PUCCH or a PUSCH. This is to prevent inconsistency of the ACK/NACK feedback between the wireless device and a BS.

However, when the number of configured cells increases, transmission of the ACK/NACK feedback corresponding to the total number of configured cells may cause waste of an uplink (UL) resource. Alternatively, as the number of configured cells increases, transmission of the ACK/NACK feedback through the UL channel may be impossible.

Hereinafter, it is proposed to adjust a code rate of an ACK/NACK feedback.

First, parameters are defined as follows.

Nc: The total number of cells configured for a wireless device

Ns: The number of scheduled cells among configured cells. The scheduled cell is a cell in which DL transmission requiring an ACK/NACK feedback is scheduled. Alternatively, Ns may be the number of subframes in which DL transmission is actually scheduled.

P: A size of an ACK/NACK payload which is determined based on a configured cell. For example, if Nc=10, then P=10 bits.

P': A size of an ACK/NACK payload size which is determined on a scheduled cell. For example, if Ns=5, then P'=5 bits.

R: Mother code rate r: Transmission code rate based on a scheduled cell

C: The number of bits of an ACK/NACK feedback to be transmitted

Figure 6:
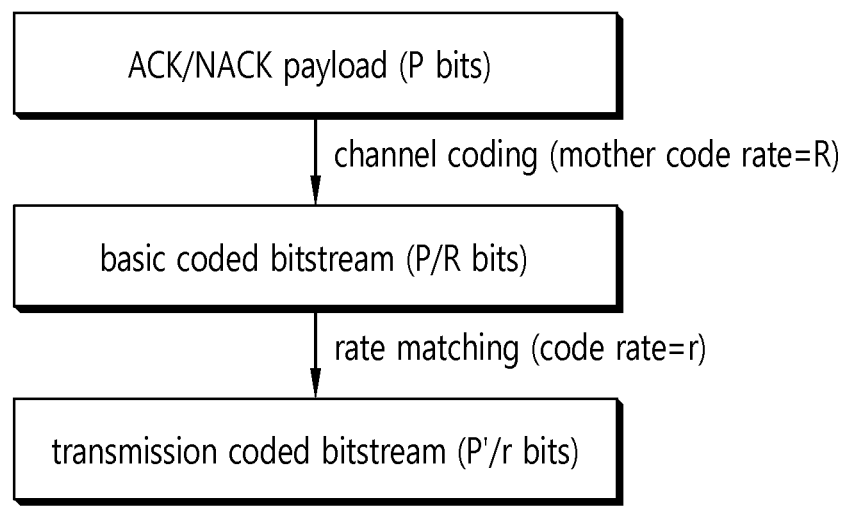
FIG. 6 shows positive-acknowledgement (ACK)/negative-acknowledgement (NACK) transmission according to an embodiment of the present invention.

FIG. 6 shows ACK/NACK transmission according to an embodiment of the present invention.

A payload size of an ACK/NACK feedback is generated according to the number of configured cells. A transmission code rate is determined according to the number of scheduled cells. The smaller the number of scheduled cells, the greater the transmission code rate to be defined. It means that the smaller the number of scheduled cells, the smaller the number of coded bits of the ACK/NACK feedback to be transmitted.

First, a wireless device generates an ACK/NACK payload of P bits according to Nc. If Nc=10, then P=10, and the ACK/NACK payload is {x(1), . . . , x(10)}. x(n) is an ACK/NACK bit for an $n^{th}$ cell.

An ACK/NACK bit corresponding to non-scheduled cells, not the scheduled cell, may be defined as ACK or NACK or a pre-defined state.

Second, the wireless device generates a basic coded bitstream by performing channel coding on the ACK/NACK payload according to a mother code rate. Channel coding may use a well-known scheme such as a turbo code or the like. The mother code rate may also be called a first code rate. The number of bits of the basic coded bitstream is P/R. For example, if R=1/3, the P/R=30 bits, and the basic coded bitstream is {y(1), . . . , y(30)}. y(n) is an $n^{th}$ bit.

Third, the wireless device generates a transmission coded bitstream by performing rate matching on the basic coded bitstream according to the transmission code rate. The transmission code rate may also be called a second code rate. A bit to be subjected to rate matching is determined according to the transmission code rate and the number of scheduled cells. Therefore, the number of bits of the transmission coded bitstream to be transmitted is C=P'/r. A code rate adjusted based on the ACK/NACK payload with respect to the total configured cells is r×(P/P').

For example, if P'=5, r=1/3, then C=15. Therefore, {y(1), ..., y(15)} is the transmission coded bitstream, and is input, modulated, and transmitted as an input bitstream of a PUCCH or a PUSCH as an ACK/NACK feedback.

For another example, if P'=5, r=1/2, then C=10. Therefore, {y(1), ..., y(10)} is the transmission coded bitstream.

A PUCCH format may be determined according to the number of bits of the ACK/NACK feedback. For example, if the ACK/NACK feedback is less than 48 bits, a PUCCH format 3 may be used, and otherwise, a PUCCH format 4 or a PUCCH format 5 may be used.

A plurality of PDSCHs may be received in one cell, and thus a plurality of ACK/NACK bits may be required. A criterion of generating the basic coded bitstream may be a total plurality of ACK/NACK bits required in the total configured cells. Alternatively, the criterion of generating the basic coded bitstream may be the number of configured cells instead of the total ACKANCK bits. The criterion of generating the transmission coded bitstream may be a total plurality of ACK/NACK bits required in the total scheduled cells. Alternatively, the criterion of generating the transmission coded bitstream may be the number of scheduled cells instead of the total ACK/NACK bits.

When the ACK/NACK feedback is transmitted on a PUCCH, PUCCH transmit power may be adjusted according to the number of scheduled cells. When the ACK/NACK feedback is transmitted on a PUSCH, PUSCH transmit power may be adjusted without consideration of the number of scheduled cells.

A BS may perform decoding by assuming that the ACK/NACK feedback is received based on the scheduled cell. Mapping to a PUCCH resource or a PUSCH resource may be achieved in the same order irrespective of the number of transmission coded bits. Even if the number of ACK/NACK coded bits is inconsistently understood between the BS and the wireless device, a possibility that the BS succeeds in decoding of the ACK/NACK feedback may increase.

The wireless device may carry information regarding a transmission code rate on the ACK/NACK feedback. In particular, in PUSCH transmission in which the ACK/NACK feedback is transmitted by being multiplexed with UL traffic, a receiving-side BS may be prevented from failing also in reception of the multiplexed UL traffic by incorrectly recognizing the transmission code rate (or a size of the transmission coded bitstream). The information regarding the transmission code rate may be masked to cyclic redundancy check (CRC) of the ACK/NACK feedback. The information regarding the transmission code rate may be masked to a coded bit of the ACK/NACK feedback. The information regarding the transmission code rate may include information regarding the number of bits of the transmission coded bitstream.

If the adjusted code rate (r×P/P') is excessively great, decoding performance may decrease significantly according to a channel coding scheme. Therefore, an upper limit of the mother code rate may be determined so that the mother code rate R does not exceed the upper limit. If the transmission code rate r is excessively small, a PUCCH/PUSCH resource may be wasted unnecessarily. Therefore, a lower limit of the transmission code rate may be determined so that the transmission code rate is not less than the lower limit.

DL DCI for scheduling each PDSCH may include a count value of a corresponding PDSCH. The wireless device may estimate how many PDSCHs are scheduled based on the count value received most recently. P' may be determined based on the count value received most recently. Alternatively, the mother code rate may be determined based on the count value received most recently.

In the aforementioned embodiment, the total number Nc of cells configured for the wireless device may be replaced with the number of activated cells. Alternatively, the number Ns of the scheduled cells may be replaced with the number of activated cells.

The aforementioned embodiment may be applied to coding of UCI transmitted by the wireless device in addition to the ACK/NACK feedback.

Figure 7:
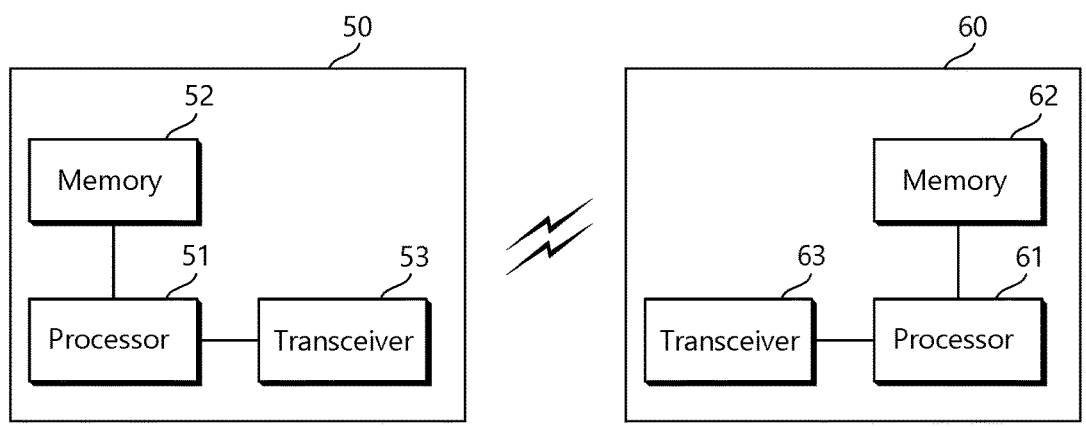
FIG. 7 is a block diagram showing a wireless communication system according to an embodiment of the present invention.

FIG. 7 is a block diagram showing a wireless communication system according to an embodiment of the present invention.

A wireless device 50 includes a processor 51, a memory 52, and a transceiver 53. The memory 52 is coupled to the processor 51, and stores various instructions executed by the processor 51. The transceiver 53 is coupled to the processor 51, and transmits and/or receives a radio signal. The processor 51 implements the proposed functions, procedures, and/or methods. In the aforementioned embodiment, an operation of the wireless device may be implemented by the processor 51. When the aforementioned embodiment is implemented with a software instruction, the instruction may be stored in the memory 52, and may be executed by the processor 51 to perform the aforementioned operation.

A BS 60 includes a processor 61, a memory 62, and a transceiver 63. The BS 60 may operate in an unlicensed band. The memory 62 is coupled to the processor 61, and stores various instructions executed by the processor 61. The transceiver 63 is coupled to the processor 61, and transmits and/or receives a radio signal. The processor 61 implements the proposed functions, procedures, and/or methods. In the aforementioned embodiment, an operation of the BS may be implemented by the processor 61.

The processor may include Application-Specific Integrated Circuits (ASICs), other chipsets, logic circuits, and/or data processors. The memory may include Read-Only Memory (ROM), Random Access Memory (RAM), flash memory, memory cards, storage media and/or other storage devices. The RF unit may include a baseband circuit for processing a radio signal. When the above-described embodiment is implemented in software, the above-described scheme may be implemented using a module (process or function) which performs the above function. The module may be stored in the memory and executed by the processor. The memory may be disposed to the processor internally or externally and connected to the processor using a variety of well-known means.

In the above exemplary systems, although the methods have been described on the basis of the flowcharts using a series of the steps or blocks, the present invention is not limited to the sequence of the steps, and some of the steps may be performed at different sequences from the remaining steps or may be performed simultaneously with the remaining steps. Furthermore, those skilled in the art will understand that the steps shown in the flowcharts are not exclusive and may include other steps or one or more steps of the flowcharts may be deleted without affecting the scope of the present invention.

What is claimed is:

1. A method of transmitting a positive-acknowledgement (ACK)/negative-acknowledgement (NACK) in a wireless communication system, the method comprising:
   generating, by a wireless device, an ACK/NACK payload according to the total number of configured cells;
   generating, by the wireless device, a basic coded bitstream by performing channel coding on the ACK/NACK payload according to a mother code rate;
   generating, by the wireless device, a transmission coded bitstream by performing rate matching on the basic coded bitstream according to a transmission code rate; and
   transmitting, by the wireless device, the transmission coded bitstream through an uplink channel.

2. The method of claim 1, wherein the number of bits of the transmission coded bitstream is determined according to the transmission code rate and the number of scheduled cells.

3. The method of claim 2, wherein the ACK/NACK payload comprises an ACK/NACK bit of at least one scheduled cell and an ACK/NACK bit of zero or more non-scheduled cells.

4. The method of claim 2, wherein the ACK/NACK payload has bits corresponding to the total number of the configured cells.

5. The method of claim 1, wherein information regarding the transmission code rate is masked to a cyclic redundancy check (CRC) of the transmission coded bitstream.

6. The method of claim 1, wherein the uplink channel is a physical uplink control channel (PUCCH) or a physical uplink shared channel (PUSCH).

7. An apparatus for transmitting a positive-acknowledgement (ACK)/negative-acknowledgement (NACK) in a wireless communication system, the apparatus comprising:
   a transceiver configured to transmit and receive a radio signal; and
   a processor coupled to the transceiver and configured to:
   generate an ACK/NACK payload according to the total number of configured cells;
   generate a basic coded bitstream by performing channel coding on the ACK/NACK payload according to a mother code rate;
   generate a transmission coded bitstream by performing rate matching on the basic coded bitstream according to a transmission code rate; and
   transmit the transmission coded bitstream through an uplink channel.

8. The apparatus of claim 7, wherein the number of bits of the transmission coded bitstream is determined according to the transmission code rate and the number of scheduled cells.

9. The apparatus of claim 8, wherein the ACK/NACK payload comprises an ACK/NACK bit of at least one scheduled cell and an ACK/NACK bit of zero or more non-scheduled cells.

10. The apparatus of claim 8, wherein the ACK/NACK payload has bits corresponding to the total number of the configured cells.

11. The apparatus of claim 7, wherein information regarding the transmission code rate is masked to a cyclic redundancy check (CRC) of the transmission coded bitstream.

12. The apparatus of claim 7, wherein the uplink channel is a physical uplink control channel (PUCCH) or a physical uplink shared channel (PUSCH).

* * * * *